United States Patent

Hirai et al.

(10) Patent No.: US 6,853,013 B2
(45) Date of Patent: Feb. 8, 2005

(54) LIGHT-EMITTING ELEMENT AND METHOD OF PRODUCING THE SAME

(75) Inventors: Hiroyuki Hirai, Minami-ashigara (JP); Hiroshi Fujimoto, Minami-ashigara (JP); Shigeru Nakamura, Minami-ashigara (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 0 days.

(21) Appl. No.: 10/375,094

(22) Filed: Feb. 28, 2003

(65) Prior Publication Data

US 2003/0160260 A1 Aug. 28, 2003

(30) Foreign Application Priority Data

Feb. 28, 2002 (JP) ........................................ 2002-054260

(51) Int. Cl.⁷ .............................................. H01L 33/00
(52) U.S. Cl. ........................... 257/103; 257/91; 257/98; 257/99; 257/40; 257/59; 257/72; 257/744
(58) Field of Search .................................. 257/103, 744, 257/40, 59, 72, 91, 98, 99

(56) References Cited

U.S. PATENT DOCUMENTS

| | | | | |
|---|---|---|---|---|
| 6,399,226 B1 | * | 6/2002 | Kitaguchi et al. | 428/690 |
| 2003/0034486 A1 | * | 2/2003 | Korgel | 257/13 |
| 2003/0218418 A9 | * | 11/2003 | Sato et al. | 313/504 |

OTHER PUBLICATIONS

Hedi Mattoussi et al., "Electroluminescence From Heterostructures of Poly(Phenylene Vinylene) and Inorganic CdSe Nanocrystals," Journal of Applied Physics, Jun. 15, 1998, pp. 7965–7974, vol. 83, No. 12, USA.

* cited by examiner

*Primary Examiner*—Minhloan Tran
*Assistant Examiner*—Tan Tran
(74) *Attorney, Agent, or Firm*—Burns, Doane, Swecker & Mathis, L.L.P.

(57) ABSTRACT

A light-emitting element comprising a transparent electrode, a light-emitting layer, and a back electrode, on a substrate, wherein the light-emitting layer comprises photoluminescent metal oxide nanoparticles having an average particle size of 1 to 50 nm; and a method of producing the same.

9 Claims, 1 Drawing Sheet

LIGHT-EMITTING ELEMENT AND METHOD OF PRODUCING THE SAME

FIELD OF THE INVENTION

The present invention relates to a light-emitting element suitable for use as an area light source of a full color display, a backlight, a lighting equipment or the like, or as a light source array of a printer or the like, and to a method of producing the same. The present invention relates particularly to a light-emitting element that is safe and inexpensive and has superior light-emitting efficiency, and to a method of producing the same.

BACKGROUND OF THE INVENTION

An organic electroluminescence element (OLED) using an organic light-emitting material is promising for use as an inexpensive, large-area, solid-state light-emission-type full-color display element or a writing light source array. Many developments thereon have been made. In general, an organic light-emitting element comprises a light-emitting layer and a pair of opposite electrodes between which the light-emitting layer is sandwiched. When an electric field is applied to between the two electrodes, electrons are injected from the cathode, and holes are injected from the anode, to the layer. In the light-emitting layer, the electrons and the holes are recombined and their energy level returns from the conduction band to the valence band, with emitting the energy as light.

Conventional organic light-emitting elements have problems that the driving voltage thereof is high, and the light-emitting brightness and light-emitting efficiency thereof are low. In recent years, however, many techniques for solving these problems have been reported. An example suggested is an organic light-emitting element wherein an organic thin film is formed by vapor deposition of an organic compound (Applied Physics Letters, Vol. 51, page 913, 1987). This organic light-emitting element has laminated two-layered type structure composed of an electron transport layer and a hole transport layer, and it has a far better light-emitting characteristics than conventional organic light-emitting elements having a single-layered structure. As the hole transporting material of this organic light-emitting element, a low-molecular amine compound is used. As the electron transporting and light-emitting material thereof, an Al complex of 8-quinolinol (Alq) is used. The light emitted therefrom is green. Thereafter, many such organic light-emitting elements wherein an organic thin film is formed by vapor deposition have been reported (see references described in Macromolecular Symposia, Vol. 125, page 1, 1997).

However, such organic light-emitting elements wherein an organic thin film is formed by vapor deposition have a problem that the light-emitting efficiency thereof is far lower than that of inorganic LED elements or fluorescent tubes. In these organic light-emitting elements, a low-molecular compound is formed into a film by a dry method, such as vapor deposition. It is therefore impossible to avoid deterioration in the characteristics thereof due to crystallization of the low-molecular compound. Furthermore, there are problems that costs for production thereof are high, and the production efficiency thereof is low.

To reduce production costs or to apply to flexible large-area elements, such as a backlight and an illumination light source, organic light-emitting elements, wherein a macromolecule light-emitting compound is formed into a film by a wet film-forming method, are developed. Examples of the macromolecular compound include polyparaphenylene vinylene, emitting green light (Nature, Vol. 347, page 539, 1990); poly(3-alkylthiophene), emitting reddish orange light (Japanese Journal of Applied Physics, Vol. 30, page L1938, 1991), and polyalkylfluorene, emitting blue light (Japanese Journal of Applied Physics, Vol. 30, page L1941, 1991). JP-A-2-223188 ("JP-A" means unexamined published Japanese patent application) reports a trial of dispersing a low-molecular compound in a binder resin, and then forming a film from the dispersion by wet coating.

However, the above organic light-emitting elements formed by wet film-forming method also have a problem that the element uses fluorescent luminescence obtained from singlet excitons, in the same way as the above organic light-emitting element formed by dry method, to therefore have only low light-emitting efficiency.

On the other hand, as an inorganic EL element using an inorganic light-emitting material, there are known a thin film-type alternating current driving element, a dispersion-type alternating current driving element, and the like. However, these inorganic light-emitting elements can give only a brightness of several hundred candelas per square meter, although the driving of the inorganic light-emitting element requires a power source supplying several hundreds of volts or hertz. Further, the production of the inorganic EL element is not necessarily easy, since it requires using a gas phase method, such as sputtering, to produce its inorganic light-emitting layer, or dispersing particles having a size of several tens of micrometers into a highly dielectric polymer.

Recently, reported was a charge injection-type, direct-current-driving element using nanoparticles of CdSe, which is an inorganic light-emitting material (H. Mattoussi et al., J. Appl. Phys., Vol. 83(12), 7965 (1998) etc.). However, this material is harmful to both the human body and the environment. Thus, there is a need to develop elements using a safe material.

SUMMARY OF THE INVENTION

The present invention is a light-emitting element comprising a transparent electrode, a light-emitting layer, and a back side electrode, on a substrate, wherein the light-emitting layer comprises photoluminescent metal oxide nanoparticles having an average particle size of 1 to 50 nm.

Further the present invention is a method of producing a light-emitting element by laminating, on a substrate, a transparent electrode, a light-emitting layer comprising photoluminescent metal oxide nanoparticles having an average particle size of 1 to 50 nm, and a back side electrode, wherein the light-emitting layer is formed by a wet film-forming method.

Other and further features and advantages of the invention will appear more fully from the following description.

DETAILED DESCRIPTION OF THE INVENTION

Figure 1:
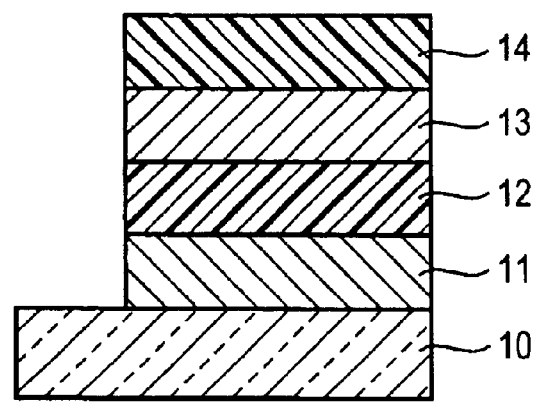
FIG. 1 is a sectional view of one embodiment of the device of the invention showing a light-emitting element comprising substrate 10, transparent electrode 11, organic conductive polymer layer 12, light-emitting layer 13 and back electrode 14.

In light of the above-mentioned problems, the present inventors made eager research. As a result, the inventors have found out that a light-emitting element, which has a light-emitting layer comprising photoluminescent metal oxide nanoparticles, is superior in light-emitting efficiency and safety and is inexpensive. Based on this discovery, the present invention has been made.

According to the present invention, there are provided:
1) A light-emitting element comprising a transparent electrode, a light-emitting layer, and a back side electrode, on a substrate, wherein the light-emitting layer comprises photoluminescent metal oxide nanoparticles having an average particle size of 1 to 50 nm.
2) A method of producing a light-emitting element, comprising the step of laminating, on a substrate, at least a transparent electrode, a light-emitting layer that contains photoluminescent metal oxide nanoparticles having an average particle size of 1 to 50 nm, and a back side electrode, with at least the light-emitting layer being formed by a wet film-forming method.

Embodiments of the present invention include the followings:
(1) A light-emitting element comprising an organic conductive polymer layer between the transparent electrode and the light-emitting layer.
(2) A method of producing a light-emitting element, wherein an organic conductive polymer layer is formed between the transparent electrode and the light-emitting layer by a wet film-forming method.

The light-emitting device of the present invention comprises a substrate laminated thereon a transparent electrode, a light-emitting layer and a back electrode, and may comprise an organic compound layer such as another light-emitting layer, an organic conductive polymer layer, a hole transport layer or an electron transport layer; a protective layer; or the like, if necessary. The respective layers may have some other functions.

In the light-emitting element of the present invention, the specific layer structure may have such a laminate on the substrate as: transparent electrode/light-emitting layer/back side electrode; transparent electrode/light-emitting layer/ electron-transport layer/back side electrode; transparent electrode/hole-transport layer/light-emitting layer/electron-transport layer/back side electrode; transparent electrode/ hole-transport layer/light-emitting layer/back side electrode; transparent electrode/organic conductive polymer layer/ light-emitting layer/back side electrode; transparent electrode/organic conductive polymer layer/light-emitting layer/electron-transport layer/back side electrode; transparent electrode/organic conductive polymer layer/hole-transport layer/light-emitting layer/electron-transport layer/ back side electrode, transparent electrode/organic light-emitting layer/metal oxide nanoparticles light-emitting layer/back side electrode, and the like. The substrate can be disposed either the transparent electrode side or the back side electrode side.

(A) Light-Emitting Layer and Organic Compound Layer
(1) Light-Emitting Layer

The photoluminescent metal oxide nanoparticles, which are to be used in the light-emitting layer, have an average particle size of 1 to 50 nm, preferably 1 to 10 nm, and more preferably 2 to 6 nm. If the average particle size of the metal oxide nanoparticles is too small, the particles are unstable. If the average particle size is too large, the light-emitting efficiency deteriorates.

The metal oxide nanoparticles are preferably made of an oxide of a metal element selected from the IIIA, IIIB, IVA, IVB, VA, VB, VIA, VIIA, VIII and IIB groups in the periodic table, and are more preferably made of a metal oxide semiconductor. Specific examples of the meal oxide semiconductor include $ZnO$, $Al_2O_3$, $Ga_2O_3$, $In_2O_3$, $ZrO_2$, $HfO_2$, $GeO_2$, $SnO_2$, $RuO_2$, $Ir_2O_3$, $Y_2O_3$ and $Eu_2O_3$.

The metal oxide nanoparticles can be obtained by a method described by L. Spanhel et al., in JACS, Vol. 113(8), 2826 (1991), and the like. The metal oxide nanoparticles obtained by these methods can be used in the light-emitting layer in the state of being dispersed as colloid or after they are purified by ultrafiltration or the like.

The content of the metal oxide nanoparticles in the light-emitting layer is not particularly limited. The content is, assuming all the solid contents in the light-emitting layer being 100% by mass, preferably from 10 to 100% by mass, more preferably from 40 to 99% by mass.

If necessary, the light-emitting layer may comprise an organic conductive polymer, a hole transport material, an electron transport material, or the like, which will be described in detail later. Further, the light-emitting layer may comprise an organic light-emitting material, such as an ortho-metallized metal complex or a porphyrin metal complex, besides the metal oxide nanoparticle, if necessary.

The film thickness of the light-emitting layer is not particularly limitative, and is preferably from 1 to 500 nm, more preferably from 5 to 100 nm.

(2) Organic Conductive Polymer Layer

An organic conductive polymer layer is preferably provided between the transparent electrode and the light-emitting layer. It is particularly effective to form the organic conductive polymer layer adjacent to the transparent electrode. In this way, a short circuit between the electrodes can be prevented, without causing a rise in the driving voltage and deterioration in the light-emitting efficiency. Examples of the organic conductive polymer include polyaniline, polythiophene and polypyrrole. The film thickness of the organic conductive polymer layer may be set arbitrary, and it is preferably from 50 to 200 nm.

(3) Hole Transport Layer

The hole transport material for use in the hole transport layer may be either a low molecular hole transport material or a macromolecular hole transport material. The kind of the material is not limited if the material has any one of the following functions: a function of injecting holes from the anode to the light-emitting layer, a function of transporting holes, and a function of blocking electrons injected from the cathode. Examples of the hole transport material include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne-series compounds, porphyrin-series compounds; conductive polymers such as polysilane-series compounds, poly(N-vinylcarbazole) derivatives, aniline-series copolymers, thiophene oligomers, and polythiophene; and high polymers such as polythiophene derivatives, polyphenylene derivatives, polyphenylene vinylene derivatives, and polyfluorene derivatives. These may be used singly or in combination of two or more thereof.

The film thickness of the hole transport layer is preferably from 10 to 200 nm, more preferably from 20 to 80 nm. If the film thickness of the hole transport layer is too thick, the driving voltage can rise. If the film thickness is too thin, the light-emitting element can cause a short-circuit.

(4) Electron Transport Layer

The kind of the electron transport material which can be used in the electron transport layer is not limited if the material has any one of the following functions: a function of transporting electrons and a function of blocking holes injected from the anode. Examples thereof include triazole derivatives, oxazole derivatives, oxadiazole derivatives, fluorenone derivatives, anthraquinodimethane derivatives, anthrone derivatives, diphenylquinone derivatives, thiopyran dioxide derivatives, carbodiimide derivatives, fluorenylidenemethane derivatives, distyrylpyrazine derivatives, heterocyclic tetracarboxylic acid anhydrides such as naphthaleneperylene, phthalocyanine derivatives, metal complexes (such as metal complexes of 8-quinolinol derivatives, metal phthalocyanines, and metal complexes containing a benzoxazole or benzothiazole as a ligand), conductive polymers such as aniline-series copolymers, thiophene oligomers and polythiophenes; high polymers such as polythiophene derivatives, polyphenylene derivatives, polyphenylene vinylene derivatives, and polyfluorene derivatives.

The film thickness of the electron transport layer is preferably from 10 to 200 nm, more preferably from 20 to 80 nm. If the film thickness of the electron transport layer is too thick, the driving voltage can rise. If the film thickness is too thin, the light-emitting element can cause a short-circuit.

(5) Formation of the Light-Emitting Layer and the Organic Compound Layer

In the present invention, the organic conductive polymer layer is generally formed by a wet film-forming method. The light-emitting layer may be formed by either a dry film-forming method or a wet film-forming method, and is preferably formed by a wet film-forming method. The organic compound layers such as the hole transport layer and the electron transport layer may be formed by either a dry film-forming method or a wet film-forming method. The wet film-forming method is advantageous, since the method allows to make the area of the organic compound layer large with ease and gives a light-emitting element superior in brightness and light-emitting efficiency at low costs and high efficiency. The kind of the film-forming method can be appropriately selected dependently on the material of each of the layers.

Examples of the dry film-forming method include vapor deposition methods and sputtering methods. Examples of the wet film-forming method include spin coating methods, dip coating methods, casting methods, die coating methods, roll coating methods, bar coating methods and gravure coating methods. In the case that the wet film-forming method is used, the film is appropriately dried after the formation of the film. Conditions for the drying are not particularly limited. The drying can be performed at such a temperature that the coating layer is not damaged. In order to prevent the incorporation of moisture, drying in the environment giving a low dew point, vacuum drying, or the like is also effective.

In the case that the light-emitting layer and the organic compound layer are applied by the wet film-forming method, the kind of a solvent used to prepare a coating solution is not particularly limited. The solvent may be appropriately selected, considering the dispersibility or solubility of the metal oxide nanoparticles and the other compounds. Specific examples of the solvent which can be used include halogen-series solvents such as chloroform, carbon tetrachloride, dichloromethane, 1,2-dichloroethane and chlorobenzene; ketone-series solvents such as acetone, methyl ethyl ketone, diethyl ketone, n-propyl methyl ketone and cyclohexanone; aromatic-series solvents such as benzene, toluene and xylene; ester-series solvents such as ethyl acetate, n-propyl acetate, n-butyl acetate, methyl propionate, ethyl propionate, γ-butyrolactone and diethyl carbonate; ether-series solvents such as tetrahydrofuran and dioxane; amide-series solvents such as dimethyl formamide and dimethyl acetamide; dimethyl sulfoxide; and water.

In the light-emitting layer and the organic compound layer, an electrically inactive polymer binder may be used, if necessary. Examples of the polymer binder include polyvinyl chlorides, polycarbonates, polystyrenes, poly(methyl methacrylate)s, poly(butyl methacrylate)s, polyesters, polysulfones, polyphenylene oxides, polybutadienes, hydrocarbon resins, ketone resins, phenoxy resins, polyamides, ethylcelluloses, vinyl acetates, ABS resins, polyurethanes, melamine resins, unsaturated polyesters, alkyd resins, epoxy resins, silicone resins, polyvinyl butyrals, and polyvinyl acetals.

(B) Substrate

Examples of the substrate material of the light-emitting element include inorganic materials such as YSZ (zirconia-stabilized yttrium) and glass; and macromolecular materials such polyesters (for example, polyethylene terephthalate, polybutylene terephthalate and polyethylene naphthalate), polystyrenes, polycarbonates, polyethersulfones, polyarylates, allyldiglycolcarbonates, polyimides, polycycloolefins, norbornene resins, poly(chlorotrifluoroethylene), Teflon (registered trade mark), and polytetrafluoroethylene-polyethylene copolymer. In particular, in the case of a flexible light-emitting element or a coating type light-emitting element, the macromolecular materials are preferred. Of the macromolecular materials, polyesters, polycarbonates, polyethersulfones, and fluorine-containing polymers such as poly(chlorotrifluoroethylene)s, Teflon (registered trade mark), and polytetrafluoroethylene-polyethylene copolymer are preferred, from the standpoints of oxygen permeability, transparency, heat resistance, dimensional stability, solvent resistance, electrical insulating properties, workability, low gas-permeability and low hygroscopicity.

Shape, structure, and size of the substrate are not particularly limited, and may be appropriately selected according to uses and purposes of use of the light-emitting element. The substrate is generally in a plate form. The substrate can be a single-layer structure or a laminated-structure. Further, the substrate can be formed of a single member or a combination of two or more members. The substrate may be colorless and transparent, or colored and transparent. The substrate is preferably colorless and transparent, since it does not scatter or attenuate the light emitted from the light-emitting layer.

A moisture permeation-preventing layer (gas barrier layer) can be provided on the front surface and/or back surface of the substrate. The material of the moisture permeation-preventing layer is preferably an inorganic substance, such as silicon nitride, silicon oxide, or the like, and the film may be formed by, for example, a high-frequency sputtering method. Further, a hardcoat layer and an undercoat layer may be provided on the substrate, if necessary.

(C) Transparent Electrode

In the present invention, the transparent electrode may be either an anode or a cathode, and is preferably an anode. Usually, it is sufficient that the anode has a function of supplying holes to the hole transport layer, the light-emitting layer and the like. Shape, structure and size of the transparent electrode are not particularly limited, and may be appropriately selected from those in known electrodes, according to uses and purposes of use of the light-emitting element. In the following, explanations will be made with respect to a case of using the transparent electrode as an anode. In the case that the transparent electrode is caused to function as a cathode, a back electrode should be caused to function as an anode.

Examples of the material of the transparent electrode include simple metals, alloys, and metal oxides, and the like, and materials having a work function of 4.0 eV or more are preferred. Specific examples of the material for the transparent electrode include: tin oxides doped with antimony (ATO) or with fluorine (FTO) or the like; conductive metal oxides such as tin oxide, zinc oxide, indium oxide, indium tin oxide (ITO), and indium zinc oxide (IZO); metals such as gold, silver, chromium and nickel; mixtures or laminates of the metal and the conductive metal oxide; inorganic conductive substances such as copper iodide and copper sulfide; laminates of the inorganic conductive substance and ITO; and the like.

The transparent electrode can be formed on the supporting substrate by a method which is appropriately selected, dependently on the material of the electrode, from wet methods such as printing methods and coating methods, physical methods such as vacuum vapor deposition methods, sputtering methods and ion plating methods, and chemical methods such as chemical vapor deposition (CVD) methods and plasma CVD methods. For example, in the case that ITO is selected as the material of the anode, the transparent electrode can be formed by a direct current or high-frequency sputtering method, a vacuum vapor deposition method, an ion plating method or the like.

The position where the transparent electrode is formed is not particularly limited, and can be appropriately selected according to the use or purpose of the light-emitting element. Preferably, the transparent electrode is formed on a surface of the substrate. In this case, the transparent electrode may be formed on the whole surface of one side of the substrate, or formed on a part thereof.

The transparent electrode can be patterned by chemical etching methods such as photolithography, physical etching methods using a laser or the like, vacuum vapor deposition or sputtering methods using a mask, lift-off methods, printing methods and the like.

The thickness of the transparent electrode can be appropriately set according to the material thereof, and is usually from 10 nm to 50 $\mu$m, preferably from 50 nm to 20 $\mu$m. The resistance value of the transparent electrode is preferably $10^3$ $\Omega/\square$ or less, preferably $10^2$ $\Omega/\square$ or less. The transparent electrode may be colorless and transparent, or colored and transparent. In order to take out light from the side of the transparent electrode, the transmittance thereof is preferably set to 60% or more, and more preferably set to 70% or more. The transmittance can be measured according to a known method using a spectrophotometer.

Electrodes described in detail in "Tomei-Dodenmaku no Shintenkai (New Development of Transparent Conductive Films)" (supervised by Yutaka Sawada, and published by CMC, 1999) and so on can be applied in the present invention. In particular, in the case of using a plastic substrate having a low heat resistance, it is preferable to use ITO or IZO as the material of the transparent electrode and to form into a film at a low temperature of 150° C. or less.

(D) Back Side Electrode

The back side electrode generally has a function as a cathode to supply electrons to the organic compound layers. Shape, structure, and size of the back side electrode is not particularly limited, and may be appropriately selected, according to uses and purposes of use of the light-emitting element, from those of known electrodes. The back side electrode may act as an anode, and in this case, the above transparent electrode acts as a cathode. In the following, the explanations will be made with respect to the case of using the back side electrode as the cathode.

As the material of the back side electrode, there can be used a metal, an alloy, a metal oxide, an electrically conductive compound, a mixture thereof, or the like. Preferably, a material having a work function of 4.5 eV or less is used. Examples of the material used for the back side electrode include: alkali metals (such as Li, Na, K and Cs); alkaline earth metals (such as Mg and Ca); gold; silver; lead; aluminum; a sodium-potassium alloy; a lithium-aluminum alloy; a magnesium-silver alloy; indium; rare earth metals (such as ytterbium); and the like. These may be used singly. However, they are preferably used in combination of two or more thereof, in view of obtaining stability and electron-injecting properties compatibly. Of these materials, alkali metals and alkali earth metals are preferred from the standpoint of electron-injecting properties. From the standpoint of storage stability, a material mainly composed of aluminum is preferred. Herein, the term "material mainly composed of aluminum" means simple substance of aluminum, and alloys and mixtures comprising aluminum and 0.01 to 10 mass % of alkali metal or alkaline earth metal (e.g. a lithium-aluminum alloy, a magnesium-aluminum alloy, and the like).

The back side electrode can be formed by wet methods such as printing methods and coating methods; physical methods such as vacuum deposition methods, sputtering methods and ion-plating methods; chemical methods such as CVD methods and plasma CVD methods; and the like. The method of forming the back electrode may be appropriately selected, considering the suitability for the material of the back electrode. For example, in the case that two or more metals are used as the materials of the back electrode, the back electrode can be formed by sputtering the metals simultaneously or successively.

Patterning of the backside electrode may be conducted according to a chemical etching method by photolithography, a physical etching method using laser, a vacuum vapor deposition method through a mask, a sputtering method, a lift-off method or a printing method.

Position of the back side electrode in the light-emitting device is not particularly limited, and may properly be selected depending upon uses and purposes of use of the light-emitting element. Preferably, the back side electrode is formed on the light-emitting layer. In this case, the back side electrode may be formed all over the one surface of the light-emitting layer or on part of the light-emitting layer.

A dielectric layer made of a fluoride of an alkali metal or alkali earth metal, or some other material may be inserted between the transparent cathode and the light-emitting layer, to have a thickness of 0.1 to 5 nm. The dielectric layer may be formed by a vacuum vapor deposition method, a sputtering method, an ion plating method, or the like.

The thickness of the back side electrode may be appropriately selected according to the material thereof, and is usually from 10 nm to 5 $\mu$m, preferably from 50 nm to 1 $\mu$m. The back side electrode may be transparent or opaque. The transparent back electrode can be formed by filming the above-mentioned material into a thin layer having a thickness of 1 to 10 nm, and then laminating a transparent conductive material such as ITO or IZO thereon.

(E) Other Layers

The light-emitting element of the present invention may have a protective layer. As the protective layer, those described in, for instance, JP-A-7-85974, JP-A-7-192866, JP-A-8-22891, JP-A-10-275682, and JP-A-10-106746, are suitably used. The material of the protective layer is not particularly limited if the material has a function of preventing moisture, oxygen, or the like, which deteriorates the light-emitting element, from entering the light-emitting element. Examples thereof include silicon oxide, silicon dioxide, germanium oxide, germanium dioxide, and the like. The shape, size, thickness and the like of the protective layer may be appropriately selected according to the use or purpose of the light-emitting element.

The protective layer is generally formed on a topmost surface of the light-emitting element. For example, in the case of an element having the substrate/the transparent electrode/the light-emitting layer/the back side electrode, disposed in this order, the protective layer is formed on the back side electrode. In the case of an element having the substrate/the back side electrode/the light-emitting layer/the transparent electrode, disposed in this order, the protective layer is formed on the transparent electrode.

The method of forming the protective layer is not limited. Examples thereof include vacuum vapor deposition methods, sputtering methods, reactive sputtering methods, molecular beam epitaxy methods, cluster ion beam methods, ion plating methods, plasma polymerization methods, plasma CVD methods, laser CVD methods, thermal CVD methods and coating methods.

A sealing layer is preferably formed in order to prevent moisture or oxygen from entering the respective layers in the light-emitting element. Examples of the material of the sealing layer include copolymers comprising tetrafluoroethylene and at least one comonomer; fluorine-containing copolymers having a cyclic structure in the main chain thereof; copolymers such as polyethylene, polypropylene, polymethyl methacrylate, polyimide, polyurea, polytetrafluoroethylene, polychlorotrifluoroethylene, polydichlorodifluoroethylene, chlorotrifluoroethylene and dichlorodifluoroethylene; water absorbent substances having a water absorption of 1% or more; moisture-proof substances having a water absorption of 0.1% or less; metals such as In, Sn, Pb, Au, Cu, Ag, Al, Tl and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; liquid fluorine-series solvents such as perfluoroalkane, perfluoroamine and perfluoroether; and dispersions wherein an absorbent for absorbing moisture or oxygen is dispersed in a liquid fluorine-series solvent.

In order to shut-off the light-emitting element from moisture or oxygen from the outside, it is also preferred to seal the light-emitting element with a sealing material using a sealing plate or a sealing container. Examples of the material used in the sealing plate or the sealing container include glass; metals such as stainless steel and aluminum; plastics such as poly(chlorotrifluoroethylene), polyester and polycarbonate; and ceramics. As the sealing material, any one of ultraviolet curing resins, thermosetting resins and two-liquid type setting resins can be used.

It is allowable to fill the space between the sealing container and the light-emitting element with a moisture absorbent or an inert liquid. The kind of the moisture absorbent is not particularly limited. Examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieves, zeolite, and magnesium oxide. The kind of the inert liquid is not limited. Examples thereof include paraffin, liquid paraffin, fluorine-series solvents (such as perfluoroalkanes, perfluoroamines and perfluoroethers), chlorine-series solvents, and silicone oils.

The light-emitting element of the present invention can be caused to emit light by applying a direct voltage (usually from 2 to 40V), an alternating voltage (usually from 2 to 50V, preferred frequency being 50 to 1 kHz), or a direct current between the transparent electrode and the back side electrode. For the driving of the light-emitting element of the present invention, methods described in the following can be utilized: JP-A-2-148687, JP-A-6-301355, JP-A-5-29080, JP-A-7-134558, JP-A-8-234685 and JP-A-8-241047; Japanese Patent No. 2,784,615; U.S. Pat. No. 5,828,429 and U.S. Pat. No. 6,023,308; and the like.

The light-emitting element of the present invention is inexpensive and is improved in light-emitting efficiency and safety. The light-emitting element of the present invention has a light-emitting layer that contains metal oxide nanoparticles having photoluminescence, therefore it can be driven with a low voltage, it is superior in light-emitting efficiency and it can be produced safely and at low costs. The luminous element according to the present invention is suitably applied to form an area light source of a full color display, a backlight, lighting equipment or the like, or to form a light source array of a printer or the like. Further, the present method of producing a light-emitting element can prepare the element at low costs.

The present invention will be described in more detail on the basis of the following examples, but the invention is not limited to these.

EXAMPLES

ZnO nanoparticles used in the following examples were synthesized by a method described by L. Spanhel et al. in JACS, Vol. 113(8), 2826(1991). $Ga_2O_3$ nanoparticles were synthesized by a method described in Japanese Patent Application No. 2001-228521. It was confirmed that both the ZnO nanoparticles and the $Ga_2O_3$ nanoparticles emitted fluorescence (Photoluminescence (PL) emission).

Example 1

A glass substrate, 0.6 mm in thickness, was cut into 2.5 cm squares, and one of the cut glass substrates was introduced into a vacuum chamber. An ITO target, containing 10% by mass of $SnO_2$, was used to form a transparent electrode, made of an ITO thin film (thickness, 0.2 $\mu$m), by DC magnetron sputtering (substrate temperature, 100° C.; oxygen pressure, $1 \times 10^{-3}$ Pa). The surface resistance of the ITO thin film was 10 Ω/□. The resultant ITO thin film was etched to produce stripes 5 mm in width.

The substrate, on which the transparent electrode was formed, was put into a washing container and washed with IPA (isopropyl alcohol). Thereafter, the substrate was subjected to UV-ozone treatment for 30 minutes. Next, the surface of the transparent electrode was spin-coated with a dispersed product, wherein polyethylene dioxythiophene/polystyrenesulfonic acid was dispersed in water (Baytron P (trade name), manufactured by BAYER AG; solid content, 1.3%), and subsequently the substrate was vacuum-dried at 150° C. for 2 hours, to form a conductive polymer layer 100 nm in thickness.

A coating solution, obtained by dissolving polyvinyl carbazole (manufactured by Aldrich; Mw=63,000) in dichloroethane, was applied onto the conductive polymer layer with a spin coater and dried, to form a hole transport layer 100 nm in thickness.

Into a colloidal solution, wherein 4% by mass of ZnO nanoparticles, having an average particle size of 2.5 nm, was dispersed in ethanol, was dissolved 0.4% by mass of 2(4-biphenyl)-5-(4-t-butylphenyl)-1,3,4-oxadiazole (PBD), which was an electron transport material. The resultant coating solution was applied onto the hole transport layer with a spin coater, and dried. As a result, a light-emitting layer 20 nm in thickness was formed.

A patterned mask (for making the light-emitting area into 5 mm×5 mm) was set on the light-emitting layer. In a vapor deposition apparatus, aluminum was then vapor deposited into a film 0.3 μm in thickness. In this way, a back electrode was formed.

Comparative Example 1

A light-emitting element was produced in the same manner as Example 1, except that no ZnO nanoparticles were added to the coating solution for the light-emitting layer.

The light-emitting elements of Example 1 and Comparative Example 1 were evaluated in the following manner. Each of the light-emitting elements was made to emit light by applying a direct voltage with a Source Measure Unit 2400 model (trade name), manufactured by Toyo Technica. The light-emission starting voltage (i.e. the voltage for giving a brightness of 1 cd/m$^2$) of the light-emitting element of Example 1 was 13 V, and that of the light-emitting element of Comparative Example 1 was 25 V. When the voltage was 2 V larger than the light-emission starting voltage, the luminous color of the light-emitting element of Example 1 was yellowish green, which was the same as the PL spectrum of ZnO. The luminous color of the light-emitting element of Comparative Example 1 was blue.

Example 2

A light-emitting element was prepared in the same manner as Example 1, except that the metal oxide nanoparticles used in the light-emitting layer was changed to $Ga_2O_3$ nanoparticles. The light-emission starting voltage of the resultant light-emitting element was 21 V, and was lower than that of the light-emitting element of Comparative Example 1. The luminous color of the light-emitting element of Example 2 was blue, in the same way as that of the light-emitting element of Comparative Example 1. However, when the brightness was 20 cd/m$^2$, the current of the light-emitting element of Example 2 was 9.9 mA, and that of the light-emitting element of Comparative Example 1 was 36.9 mA. It was learned from these results that the light-emitting element of the present invention, in which its light-emitting layer comprised metal oxide nanoparticles, was superior in light-emitting efficiency.

Example 3

A solution was prepared by dissolving 1% by mass of poly(2-methoxy-5-(2'-ethyl)hexoxyphenylenevinylene) (MEH-PPV), which was both a conductive polymer and a light-emitting material, in dichloroethane. This was used as a coating solution for a polymer light-emitting layer. A light-emitting element was prepared in the same manner as Example 1, except that a polymer light-emitting layer, 100 nm in thickness, was formed instead of the hole transport layer, and further, a light-emitting layer was formed by applying a colloidal solution in which 4% by mass of ZnO nanoparticles were dispersed in ethanol.

Comparative Example 2

A light-emitting element for comparison was prepared in the same manner as Example 3, except that the light-emitting layer containing the colloid of ZnO nanoparticles was not formed.

The light-emission starting voltage of the light-emitting element of Example 3 was 6V, and that of the light-emitting element of Comparative Example 2 was 8 V. Both the elements exhibited the luminous color of orange. The highest brightness of the light-emitting element of Example 3 was 1015 cd/m$^2$, while that of the light-emitting element of Comparative Example 2 was 103 cd/m$^2$. Further, the light-emitting element of Example 3 exhibited a light-emitting efficiency 7.6 times higher than that of Comparative Example 2.

Having described our invention as related to the present embodiments, it is our intention that the invention not be limited by any of the details of the description, unless otherwise specified, but rather be construed broadly within its spirit and scope as set out in the accompanying claims.

What is claimed is:

1. A light-emitting element comprising a transparent electrode, a light-emitting layer, and a back electrode, on a substrate, wherein the light-emitting layer comprises photoluminescent metal oxide nanoparticles having an average particle diameter of 1 to 50 nm, wherein the transparent electrode is an anode, the thickness of the transparent electrode is from 50 nm to 20 μm, the resistance value of the transparent electrode is 10$^3$ Ω/square or less, and an organic conductive polymer layer is further provided between the transparent electrode and the light-emitting layer, the film thickness of the organic conductive polymer layer being fro 50 to 200 nm.

2. The light-emitting element as claimed in claim 1, wherein the average particle diameter of the metal oxide nanoparticles is 1 to 10 nm.

3. The light-emitting element as claimed in claim 1, wherein the metal oxide is an oxide of a metal element selected from the IIIA, IIIB, IVA, IVB, VA, VB, VIA, VIIa, VIII and IIB groups in the periodic table.

4. The light-emitting element as claimed in claim 1, wherein the metal oxide is a metal oxide semiconductor.

5. The light-emitting element as claimed in claim 1, wherein the metal oxide nanoparticles are contained in an amount 10 to 100% by mass based on total solid contents in the light-emitting layer.

6. The light-emitting element as claimed in claim 1, wherein the thickness of the light-emitting layer is 1 to 500 nm.

7. The light-emitting element as claimed in claim 1, wherein the light-emitting layer further comprises at least one of an organic conductive polymer, a hole transport material, and an electron transport material.

8. The light-emitting element as claimed in claim 1, wherein the organic conductive polymer is selected from the group consisting of polyaniline, polythiophene and polypyrrole.

9. The light-emitting element as claimed in claim 1, wherein the organic conductive polymer is a polyethylene dioxythiophene/polystyrene sulfonic acid or a salt thereof.

* * * * *